United States Patent
Kirvan et al.

(10) Patent No.: US 10,339,047 B2
(45) Date of Patent: Jul. 2, 2019

(54) ALLOCATING AND CONFIGURING PERSISTENT MEMORY

(71) Applicant: Intel Corporation, Santa Clara, CA (US)

(72) Inventors: Scott W. Kirvan, Longmont, CO (US); Andy M. Rudoff, Boulder, CO (US); Mahesh S. Natu, Folsom, CA (US); Murugasamy K. Nachimuthu, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/176,289

(22) Filed: Oct. 31, 2018

(65) Prior Publication Data
US 2019/0065364 A1    Feb. 28, 2019

Related U.S. Application Data

(62) Division of application No. 14/580,125, filed on Dec. 22, 2014, now Pat. No. 10,126,950.

(51) Int. Cl.
*G06F 12/00* (2006.01)
*G06F 12/02* (2006.01)
*G11C 5/04* (2006.01)

(52) U.S. Cl.
CPC .. *G06F 12/0246* (2013.01); *G06F 2212/2542* (2013.01); *G06F 2212/7204* (2013.01); *G11C 5/04* (2013.01); *Y02D 10/13* (2018.01)

(58) Field of Classification Search
CPC ......... G06F 12/0246; G06F 2212/2542; G06F 2212/7204
See application file for complete search history.

(56) References Cited

U.S. PATENT DOCUMENTS

| 6,601,212 B1 | 7/2003 | Guha et al. |
| 2003/0028800 A1 | 2/2003 | Dayan et al. |

(Continued)

FOREIGN PATENT DOCUMENTS

| CN | 107077303 A | 8/2017 |
| WO | 2011/080769 A1 | 7/2011 |
| WO | 2016/105790 A1 | 6/2016 |

OTHER PUBLICATIONS

International Preliminary Report on Patentability received for International Application No. PCT/US2015/062277, dated Jul. 6, 2017, 11 pages.

(Continued)

*Primary Examiner* — Gurtej Bansal
(74) *Attorney, Agent, or Firm* — Spectrum IP Law Group LLC

(57) ABSTRACT

Methods and apparatus to allocating and/or configuring persistent memory are described. In an embodiment, memory controller logic configures non-volatile memory into a plurality of partitions at least in part based on one or more attributes. One or more volumes (visible to an application or operating system) are formed from one or more of the plurality of partitions. Each of the one or more volumes includes one or more of the plurality of partitions having at least one similar attribute from the one or more attributes. In another embodiment, memory controller logic configures a Non-Volatile Memory (NVM) Dual Inline Memory Module (DIMM) into a persistent region and a volatile region. Other embodiments are also disclosed and claimed.

20 Claims, 10 Drawing Sheets

(56) References Cited

U.S. PATENT DOCUMENTS

| | | |
|---|---|---|
| 2007/0132049 A1 | 6/2007 | Stipe |
| 2008/0040540 A1* | 2/2008 | Cavallo ................ G06F 3/0613 711/114 |
| 2008/0155331 A1 | 6/2008 | Rothman et al. |
| 2008/0320209 A1 | 12/2008 | Lee et al. |
| 2011/0035540 A1* | 2/2011 | Fitzgerald ............... G06F 3/061 711/103 |
| 2011/0107018 A1 | 5/2011 | Honda |
| 2016/0011802 A1 | 1/2016 | Berke |

OTHER PUBLICATIONS

Letters of Patent received for Taiwanese Patent Application No. 104138576, dated Jan. 21, 2017 as Patent No. I567551, 2 pages including 1 page of English translation.

International Search Report and Written Opinion received for International Application No. PCT/US2015/062277, dated May 12, 2016, 22 pages.

* cited by examiner

US 10,339,047 B2

ALLOCATING AND CONFIGURING PERSISTENT MEMORY

RELATED APPLICATIONS

This application is a divisional under 35 U.S.C. § 121 of and claims priority under 35 U.S.C. § 120 to U.S. patent application Ser. No. 14/580,125, filed Dec. 22, 2014, entitled ALLOCATING AND CONFIGURING PERSISTENT MEMORY. The entire disclosure(s) of these documents are incorporated by reference herein for all purposes.

FIELD

The present disclosure generally relates to the field of electronics. More particularly, some embodiments generally relate to allocating and/or configuring persistent memory.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile (or persistent memory) are available beyond the run-time of a program and can be reused. Moreover, new data is typically generated as volatile data first, before a user or programmer decides to make the data persistent. For example, programmers or users may cause mapping (i.e., instantiating) of volatile structures in volatile main memory that is directly accessible by a processor. Persistent data structures, on the other hand, are instantiated on non-volatile storage devices like rotating disks attached to Input/Output (I/O or IO) buses or non-volatile memory based devices like flash memory.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increased cooling requirements, etc.), shorten component life, limit locations at which a device may be used, etc.

Hard disk drives provide a relatively low-cost storage solution and are used in many computing devices to provide non-volatile storage. Disk drives, however, use a lot of power when compared with non-volatile memory such as flash memory or solid state drives since a disk drive needs to spin its disks at a relatively high speed and move disk heads relative to the spinning disks to read/write data. This physical movement generates heat and increases power consumption. Also, flash-based drives are much faster at performing read and write operations when compared with hard drives. To this end, many computing segments are migrating towards flash memory devices that are non-volatile.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
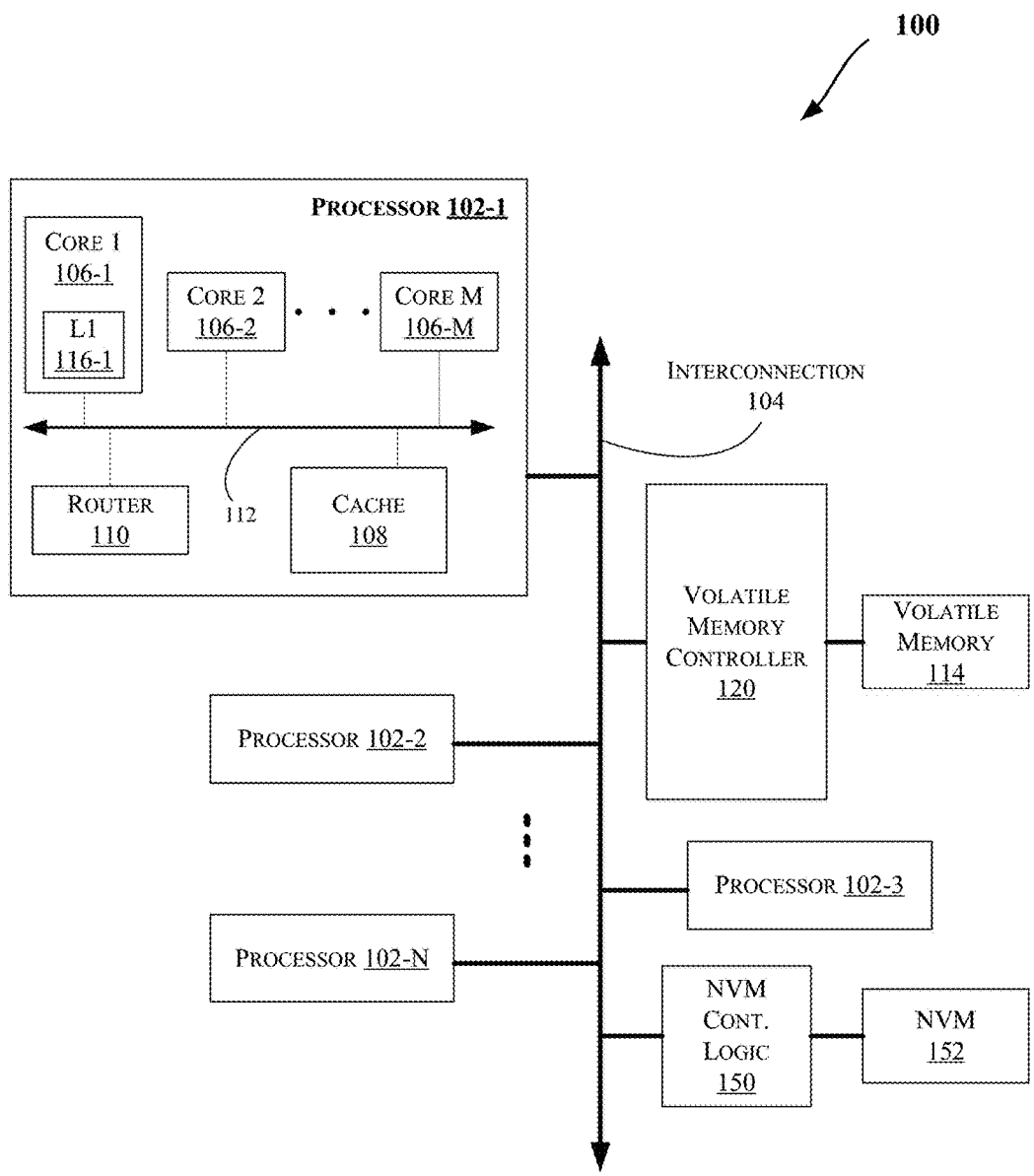
FIGS. 1, 2, 5, 6, and 7 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As indicated above, volatile memory in use in computer systems today is for the most part a homogenous resource, allocated to software processes on a temporary basis. An embodiment is concerned with persistent memory, configured with unique characteristics that best suit the performance and reliability needs of data stored on a long-term basis. As discussed herein, persistent memory is considered to be memory that is byte addressable like normal Dynamic Random Access Memory or DRAM (that is also referred to sometimes as main memory), but which maintains its contents across system resets or power loss. Examples of such persistent memory include byte addressable 3-Dimensional Cross Point Memory (such as PCM (Phase Change Memory), Resistive Random Access Memory, Magnetoresistive RAM, Spin Transfer Torque RAM (STTRAM). Some embodiments relate to discovery of regions of persistent memory with unique performance and/or reliability characteristics; organization of these regions into Quality of Service (QoS) pools; and/or allocation of application visible volumes of persistent memory from these QoS pools.

Furthermore, non-volatile memory (also interchangeably referred to herein as "persistent memory"), when introduced within processor (also referred to herein interchangeably as "CPU" or Central Processing Unit) memory hierarchy, provides significant configuration flexibility. Furthermore, an NVM (Non-Volatile Memory) DIMM (Dual Inline Memory Module) may be partitioned into a volatile region and a persistent region. These regions may be operated in various interleave or RAS (Reliability, Availability, and Serviceability) modes to fit the workload behavior and user requirements. For example, RAS may be applied in configurations that impact the durability of data, such as mirroring that maintains two copies of user data to increase data durability. Initial NVM configuration may be performed by system BIOS (Basic Input/Output System) since it has implications to CPU address map. However, BIOS is not in a position to understand user needs or characterize workload behavior. To this end, some embodiments: (a) enable users to take full advantage of the flexibility provided by partitioned NVM DIMMs; (b) minimize the chance of user data loss due to BIOS configuration errors; and/or (c) enable users to retrieve the persistent data stored on the DIMM even in the case of motherboard failures.

Moreover, the techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-7. More particularly, FIG. 1 illustrates a block diagram of a computing system 100, according to an embodiment. The system 100 includes one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 120, logic 150, memory controllers (such as those discussed with reference to FIGS. 5-7), NVM (Non-Volatile Memory) 152 (e.g., including flash memory, a Solid State Drive (SSD)), etc., or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a volatile memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a volatile memory controller 120. System 100 also includes NVM memory controller logic 150 to couple NVM memory 152 to various components of the system 100. NVM memory (persistent memory) 152 includes non-volatile memory such as nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory such as PCM (Phase Change Memory), etc. in some embodiments. Even though the memory controller 150 is shown to be coupled between the interconnection 104 and the memory 152, the logic 150 may be located elsewhere in system 100. For example, logic 150 (or portions of it) may be provided within one of the processors 102, controller 120, etc. in various embodiments. In an embodiment, logic 150 and NVM 152 are included in an SSD. Moreover, logic 150 controls access to one or more NVM devices 152 (e.g., where the one or more NVM devices are provided on the same integrated circuit die in some embodiments), as discussed herein with respect to various embodiments. Also, memory controller 120 and NVM controller 150 may be combined into a single controller in an embodiment.

Figure 2:
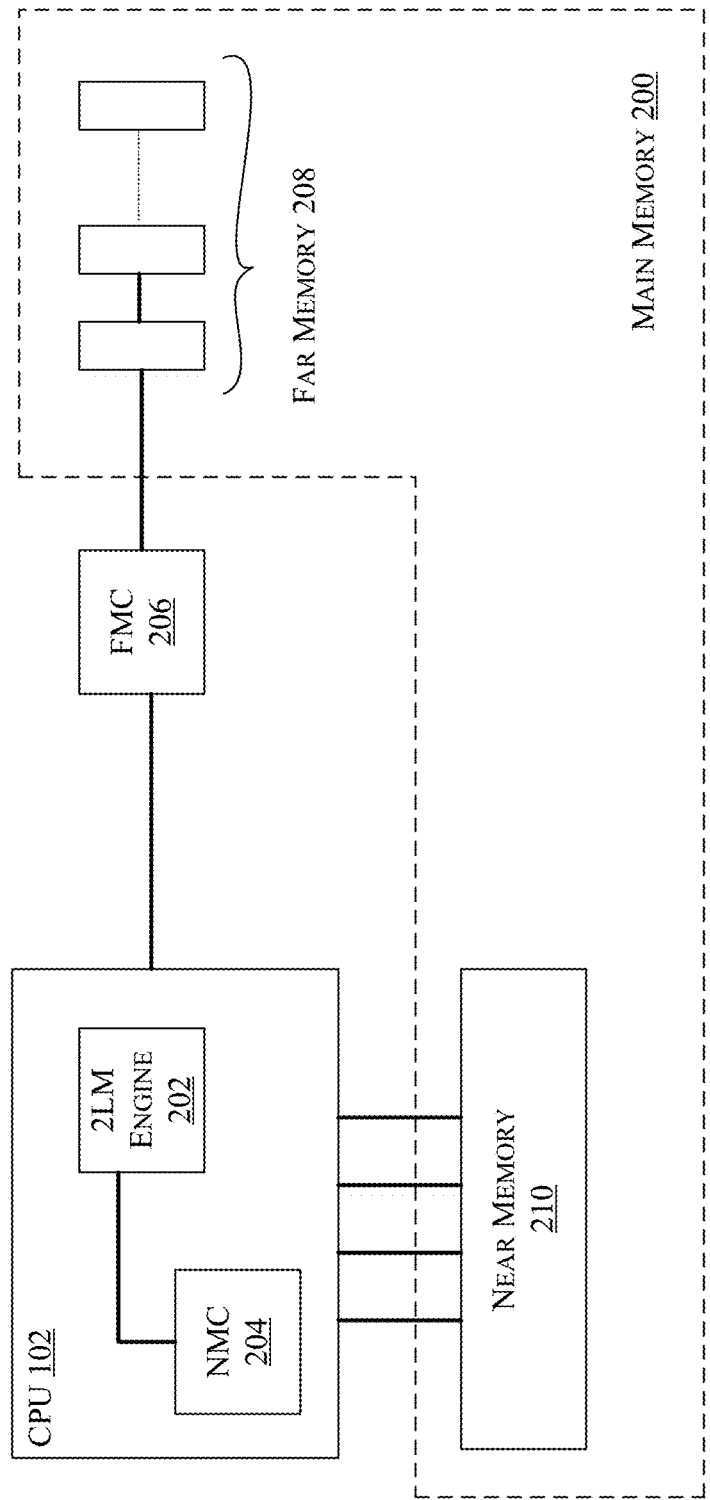

FIG. 2 illustrates a block diagram of two-level system main memory, according to an embodiment. Some embodiments are directed towards system main memory 200 comprising two levels of memory (alternatively referred to herein as "2LM") that include cached subsets of system disk level storage (in addition to, for example, run-time data). This main memory includes a first level memory 210 (alternatively referred to herein as "near memory") comprising smaller faster memory made of, for example, volatile memory 114 (e.g., including DRAM (Dynamic Random Access Memory)), NVM 152, etc.; and a second level memory 208 (alternatively referred to herein as "far memory") which comprises larger and slower (with respect to the near memory) volatile memory (e.g., memory 114) or nonvolatile memory storage (e.g., NVM 152).

In an embodiment, the far memory is presented as "main memory" to the host Operating System (OS), while the near memory is a cache for the far memory that is transparent to the OS, thus rendering the embodiments described below to appear the same as general main memory solutions. The management of the two-level memory may be done by a combination of logic and modules executed via the host central processing unit (CPU) 102 (which is interchangeably referred to herein as "processor"). Near memory may be coupled to the host system CPU via one or more high bandwidth, low latency links, buses, or interconnects for efficient processing. Far memory may be coupled to the CPU via one or more low bandwidth, high latency links, buses, or interconnects (as compared to that of the near memory).

Referring to FIG. 2, main memory 200 provides run-time data storage and access to the contents of system disk storage memory (such as disk drive 528 of FIG. 5 or data storage 648 of FIG. 6) to CPU 102. The CPU may include cache memory, which would store a subset of the contents of main memory 200. Far memory may comprise either volatile or nonvolatile memory as discussed herein. In such embodiments, near memory 210 serves a low-latency and high-bandwidth (i.e., for CPU 102 access) cache of far memory 208, which may have considerably lower bandwidth and higher latency (i.e., for CPU 102 access).

In an embodiment, near memory 210 is managed by Near Memory Controller (NMC) 204, while far memory 208 is managed by Far Memory Controller (FMC) 206. FMC 206 reports far memory 208 to the system OS as main memory (i.e., the system OS recognizes the size of far memory 208 as the size of system main memory 200). The system OS and system applications are "unaware" of the existence of near memory 210 as it is a "transparent" cache of far memory 208.

CPU 102 further comprises 2LM engine module/logic 202. The "2LM engine" is a logical construct that may comprise hardware and/or micro-code extensions to support two-level main memory 200. For example, 2LM engine 202 may maintain a full tag table that tracks the status of all architecturally visible elements of far memory 208. For example, when CPU 102 attempts to access a specific data segment in main memory 200, 2LM engine 202 determines whether the data segment is included in near memory 210; if it is not, 2LM engine 202 fetches the data segment in far memory 208 and subsequently writes the data segment to near memory 210 (similar to a cache miss). It is to be understood that, because near memory 210 acts as a "cache" of far memory 208, 2LM engine 202 may further execute data perfecting or similar cache efficiency processes.

Further, 2LM engine 202 may manage other aspects of far memory 208. For example, in embodiments where far memory 208 comprises nonvolatile memory (e.g., NVM 152), it is understood that nonvolatile memory such as flash is subject to degradation of memory segments due to significant reads/writes. Thus, 2LM engine 202 may execute functions including wear-leveling, bad-block avoidance, and the like in a manner transparent to system software. For example, executing wear-leveling logic may include selecting segments from a free pool of clean unmapped segments in far memory 208 that have a relatively low erase cycle count.

In some embodiments, near memory 210 may be smaller in size than far memory 208, although the exact ratio may vary based on, for example, intended system use. In such embodiments, it is to be understood that because far memory 208 may comprise denser and/or cheaper nonvolatile memory, the size of the main memory 200 may be increased cheaply and efficiently and independent of the amount of DRAM (i.e., near memory 210) in the system.

In one embodiment, far memory 208 stores data in compressed form and near memory 210 includes the corresponding uncompressed version. Thus, when near memory 210 request content of far memory 208, FMC 206 retrieves the content and returns it in fixed payload sizes tailored to match the compression algorithm in use (e.g., a 256B transfer).

In an embodiment, a mechanism is provided for managing regions of persistent memory with unique performance and/or reliability characteristics. The characteristics are similar to Redundant Array of Independent Disks (RAID) 6 in an embodiment. The regions of persistent memory are organized into pools and the pools serve as the source of capacity for volumes in some embodiments. The advantages of this system are: (a) persistent memory regions can have valuable, unique characteristics; (b) regions are grouped into pools with like characteristics, reducing the complexity of configuring the system; and/or (c) volumes with specific characteristics can be created from pools and can be allocated with applications that benefit from those characteristics.

Accordingly, some embodiments: (1) allow for multiple persistent memory regions each with unique, valuable characteristics; (2) abstract and simplify configuration of persistent memory by introducing the concepts of pools and volumes; (3) provide application visible persistent memory volumes which retain the unique, valuable characteristics of the pool from which they were created; and/or (4) allow applications to benefit from being able to use volumes with matching characteristics.

Figure 3A:
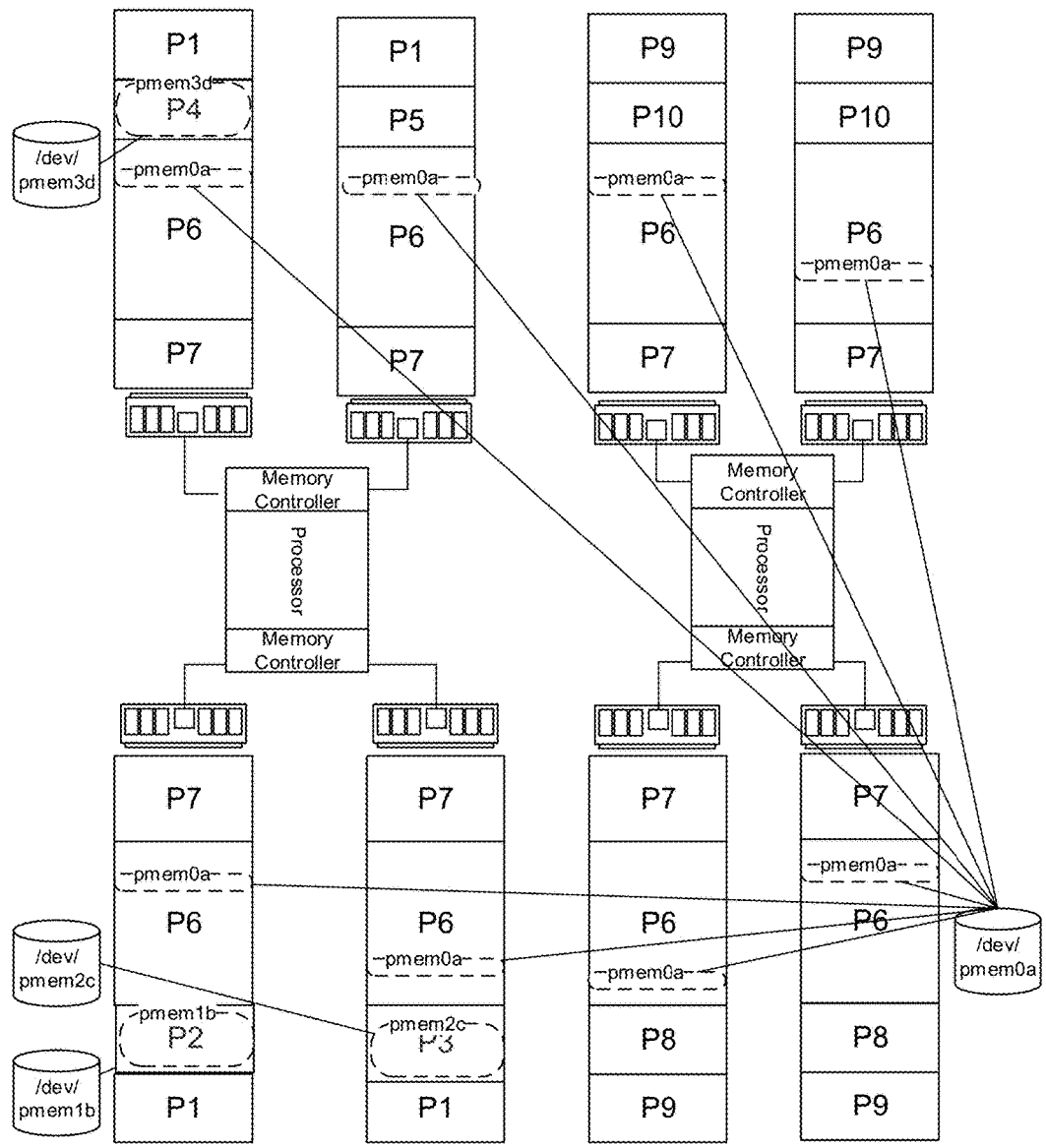
FIG. 3A shows a block diagram of a configured memory system, according to an embodiment.

FIG. 3A shows a block diagram of a configured memory system, according to an embodiment. Sample NUMA (Non-Uniform Memory Access) blocks are shown in FIG. 3A, as indicated by the Px (or Partition x) labels. FIG. 3A shows various DIMMs (each illustrated as a column with multiple partitions). Each DIMM is coupled to a respective memory controller (such as the memory controllers discussed herein with reference to FIGS. 1-2 and 5-7). In an embodiment, interleaving and/or mirroring operations are done in the memory controller(s).

Figure 3B:
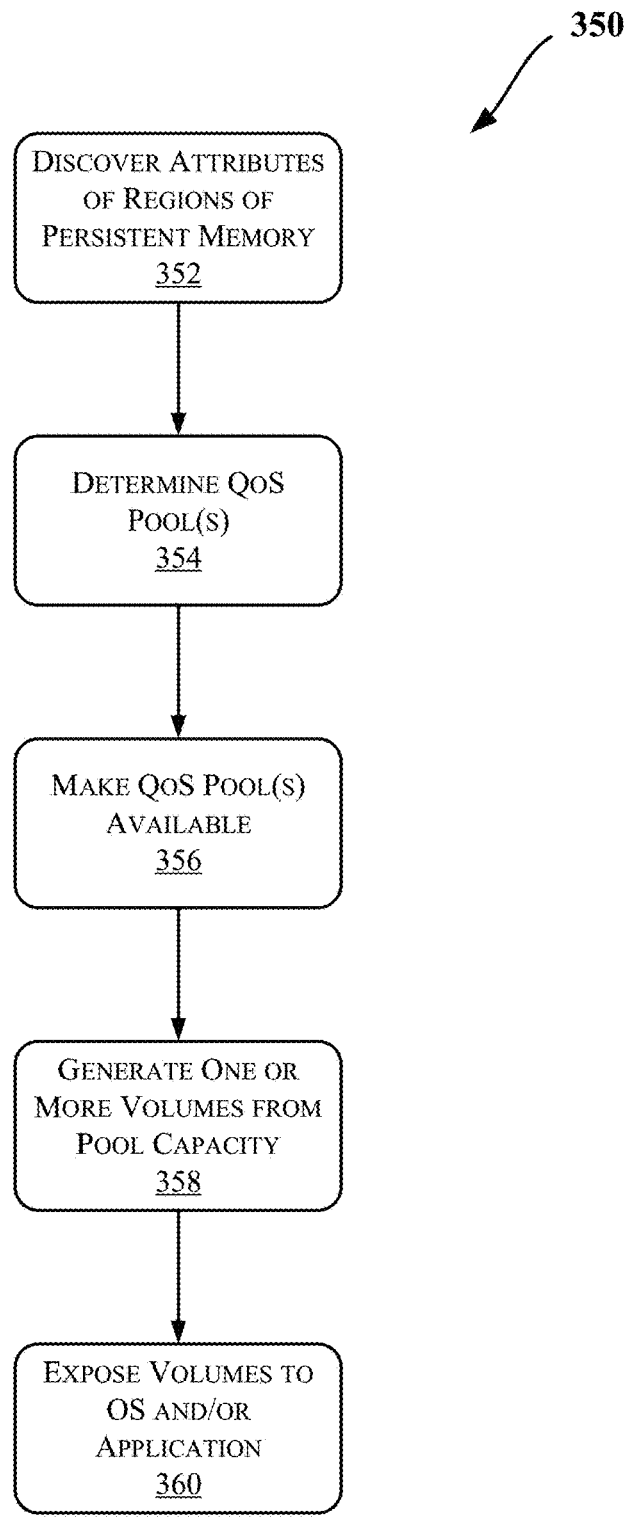
FIG. 3B illustrates a flow diagram of a method to configure memory, in accordance with an embodiment.

In FIG. 3A, P1-P10 indicate the following sample characteristics that might be associated with different pools of persistent memory. P1 thru' P10 represent different pools with differing characteristics:

P1: NUMA, 256 B Channel/4K iMC (integrated Memory Controller) Interleave, Socket Fault Domain
P2: NUMA, No Interleave, DIMM Fault Domain
P3: NUMA, No Interleave, DIMM Fault Domain
P4: NUMA, No Interleave, DIMM Fault Domain
P5: NUMA, No Interleave, DIMM Fault Domain
P6: UMA, 4K Channel/1 MB iMC Interleave System Fault Domain
P7: UMA, Block Addressable, System Fault Domain
P8: NUMA, Mirrored, DIMM Fault Domain
P9: NUMA, 1 MB Channel/1 MB iMC Interleave, Socket Fault Domain
P10: NUMA, Mirrored, DIMM, Fault Domain FIG. 3B illustrates a flow diagram of a method 350 to configure memory, in accordance with an embodiment. In one embodiment, various components discussed with reference to FIGS. 1-3A and 5-7 may be utilized to perform one or more of the operations discussed with reference to FIG. 3B. In an embodiment, one or more operations of method 350 are implemented in logic (e.g., firmware), such as logic 150 and/or controller 120 of FIG. 1 and/or other memory controllers discussed with reference to the other figures.

Referring to FIGS. 1 through 3B, at an operation 352, attributes of regions of persistent memory are detected or discovered (these are shown as Px labeled blocks in the diagram). In some embodiments, the attributes considered include one or more of: UMA, NUMA, interleave type, communication channel width/speed, type of fault domain (e.g., system, DIMM, socket, etc.), mirroring state (i.e., mirrored or not mirrored), etc. At operation 354, regions with like characteristics/attributes are organized into QoS (Quality of Service) pools. Regions which contribute capacity to a given pool are labeled Px in the diagram where x is the pool number.

At operation 356, the QoS pools are made available to a system administrator, for example, in the form of one or more of: a pool name, the performance and/or reliability characteristics of the persistent memory in the pool, and/or the available capacity within the pool.

At operation 358, the administrator creates one or more volumes from pool capacity. These are shown as cylinders in the diagram. In the case of volume "v1" in the diagram, it is composed of extents from pool P6 which is an UMA (Uniform Memory Access), interleaved pool that contains regions from all the Non-Volatile DIMMs (NVDIMMs) within the system. Likewise, volume "v2" uses a single extent from pool P2 and has NUMA performance characteristics and its fault domain is a single NVDIMM. In a datacenter environment, volumes from individual nodes can be combined and managed as a single resource with specific QoS characteristics. For example, a CSP (Cloud Service Provider) may offer two types of virtual machine instances, one with highly reliable persistent storage and one with high performance storage. These instances can be formed from pools P10 and P1, respectively. CSP can provision the nodes such that the expected amount of capacity is available in each QoS Pool.

At operation 360, volumes are exposed to the operating system and/or applications as a persistent memory or block device. At operation 312, volumes are allocated to applications with matching characteristics. For example, "v1" is allocated to workload that is not NUMA optimized.

In some embodiments, a Software Defined Datacenter can introduce increasing levels of automation as follows:

(1) Automate Volume Creation: QoS volumes can be dynamically created and destroyed in response to workload demands. Since the volumes are persistent, these can only be deleted when the application that owns them is permanently retired;

(2) Automate Pools Creation: QoS pools can be dynamically expanded and/or contracted in response to workload demands;

(3) Highest level of automation can be reached when new QoS pool types can be introduced as new types of workloads emerge. For example, the needs of an application that requires more predictable storage bandwidth can be met by volume that spans an entire persistent DIMM. A pool with that QoS characteristic is not in the original list (see FIG. 3A), but can be defined in accordance with techniques discussed herein.

Moreover, persistent memory is a new programming paradigm that is slowly being accepted by the industry. With the help of some embodiments described herein, applications are able to get the most out of persistent memory. Also, such embodiments can be used to ensure persistent memory technology fits inside a Software Defined Storage (SDS) infrastructure or vision, leading to a more dynamic datacenter.

As discussed above, non-volatile memory, when introduced within CPU memory hierarchy, provides significant configuration flexibility. Furthermore, an NVM DIMM may be partitioned into a volatile region and a persistent region. These regions may be operated in various interleave or RAS modes to fit the workload behavior and user requirements. Initial NVM configuration may be performed by system BIOS (Basic Input/Output System) since it has implications to CPU address map. However, BIOS is not in a position to understand user needs or characterize workload behavior. To this end, some embodiments: (a) enable users to take full advantage of the flexibility provided by partitioned NVM DIMMs; (b) minimize the chance of user data loss due to BIOS configuration errors; and/or (c) enable users to retrieve the persistent data stored on the DIMM even in the case of motherboard failures.

However, the NVM DIMMs on the market today do not provide this level of flexibility, so the industry has not encountered this problem so far. For example, type 1 NVM DIMMs contain DRAM backed by NV (Non-Volatile) memory. The DRAM is directly mapped in CPU address space, but these DIMMs cannot be used as NV storage. Also, type 3 NVM DIMMs appear like block devices, but cannot be used in volatile mode and the NVM on these DIMMs cannot be directly mapped in CPU address space. Accordingly, configuration of NVM DIMMs becomes a problem as manufacturers introduce next generation NVM technologies that provide tremendous amount of flexibility. To this end, some embodiments can provide flexibility for such upcoming NVM technologies.

Some current implementations include DIMM SPD (Serial Presence Detect) ROM (Read-Only Memory), disk partition data, and RAID metadata. The following three tables describe how the embodiments are different from each of these:

TABLE 1

|  | DIMM SPD ROM | DATA STRUCTURES DEFINED IN SOME EMBODIMENTS |
| --- | --- | --- |
| PURPOSE | Describes raw hardware capabilities of the DIMM | Describe how raw hardware capacity is exposed to applications |
| DIMM CAPACITY FIELDS | Describes total storage capacity of the DIMM | Describes how the total storage capacity can be subdivided in volatile and persistent partitions |
| CONFIGURED BY | DIMM manufacturer alone | Management software based on end user policies and/or workload behavior |
| INTER-DIMM RELATIONSHIP | Out of scope | Can describe interleaving relationships |
| ROLE OF MANAGEMENT SOFTWARE | Not applicable | Complex configuration decisions means management software can play a big role in creating these structures |

TABLE 2

|  | PARTITION DATA FOUND ON SOME DISKS | DATA STRUCTURES DEFINED IN SOME EMBODIMENTS |
| --- | --- | --- |
| PURPOSE | maps the drive usage to the OS and non-OS partitions | OS visible storage is subdivided among various application types |
| CONFIGURED BY | OEM or end user | Management software based on end user policies and workload behavior |
| CONFIGURATION CHANGES | Not applicable. Generally one time activity during system provisioning | More dynamic since it has dependency on workloads. Re-provisioning is likely. |
| INTER-DEVICE RELATIONSHIP | Out of scope, limited to a single disk | Can describe interleaving relationships between multiple devices |
| ROLE OF MANAGEMENT SOFTWARE | Very limited if any | Complex configuration decisions means management software can play a big role in creating these structures |

TABLE 3

|  | META-DATA ON RAID DRIVES | DATA STRUCTURES DEFINED IN SOME EMBODIMENTS |
| --- | --- | --- |
| PURPOSE | describes how data is interleaved and configured into RAID volumes across multiple disks | describes how data is interleaved across multiple devices and how each device is subdivided into volatile and persistent partition |

TABLE 3-continued

| | META-DATA ON RAID DRIVES | DATA STRUCTURES DEFINED IN SOME EMBODIMENTS |
|---|---|---|
| IMPACT TO CPU ADDRESS MAP | No | Yes |
| IS BIOS INVOLVED DURING CONFIGURATION | No, configuration/ reconfiguration is handled in the context of OS or RAID stack. | Yes. Under an embodiment, the management software creates the desired configuration, and BIOS applies it. These data structures can represent the interface between management software and BIOS. |

Figure 4A:
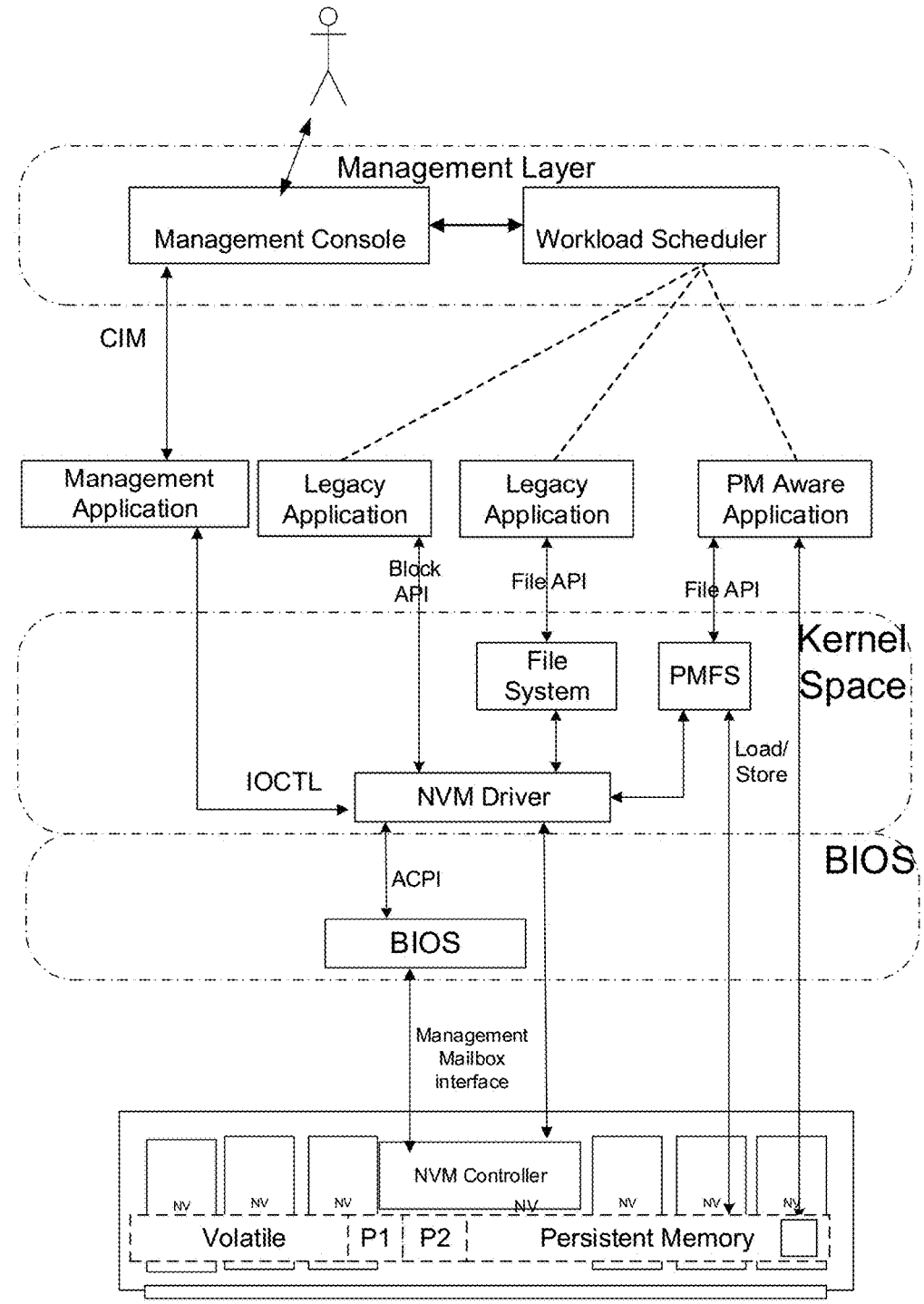
FIG. 4A shows a datacenter level view of NVM management architecture, according to an embodiment.

FIG. 4A shows a datacenter level view of NVM management architecture, according to an embodiment. Some components are described below. Each NVM DIMM, shown at the very bottom, can be partitioned into volatile and persistent/non-volatile regions. These two regions are mapped in CPU address space. Each DIMM also contains two management partitions, P1 and P2. P1 and P2 are accessible via a dedicated management (e.g., mailbox) interface. The mailbox interface is implemented in the NVM controller. Management partitions are accessible even when the NVM DIMM is not otherwise configured, i.e., volatile and persistent regions are not mapped into CPU address space.

BIOS as well as NMV driver utilizes the mailbox interface to access the management partitions. NVM driver enumerates NVM DIMMs with the help of Advanced Configuration and Power Interface (ACPI) specification (e.g., revision 5.0a, Nov. 13, 2013) tables and/or Unified Extensible Firmware Interface (UEFI) Specification (e.g., version 2.4, published July 2013). For example, the tables specify DIMM population, configuration options/restrictions, etc.

The local management application component accesses the management partition 2 by sending IOCTL (Input/Output Control) messages to the NVM driver. Various types of File systems can be layered on top of the NVM driver. Together, the NVM driver and file systems provide standard block and file system APIs (Application Programming Interfaces) to legacy applications. PM (or Persistent Memory) aware applications (referring to software that has been modified to understand that memory can be persistent and it locates and reuses content previously saved in the persistent memory) on the other hand, are able to bypass the driver layer and access the NVM directly via load/store instructions, e.g., for increased performance.

In a datacenter environment, the workload scheduler at the management software layer is aware of which applications are running on each system and can therefore make recommendations regarding the partitioning of the NVM DIMMs across volatile and persistence regions, etc.

Figure 4B:
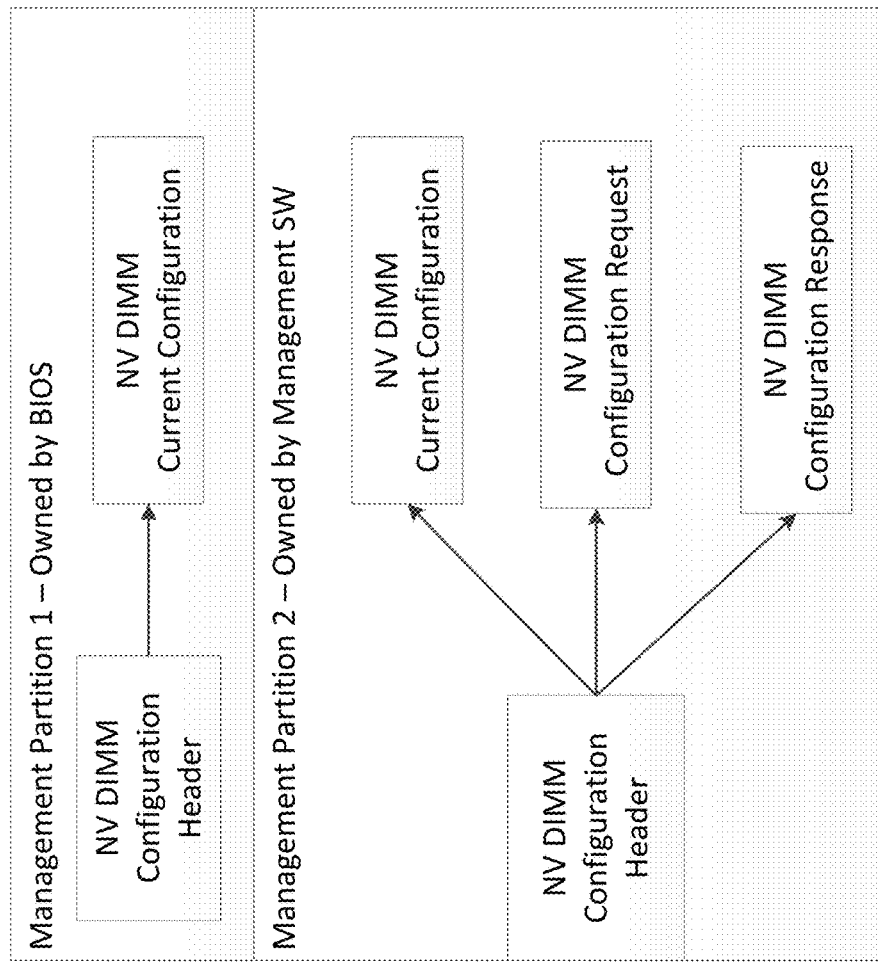
FIG. 4B illustrates a block diagram of two management partitions, according to an embodiment.

FIG. 4B illustrates a block diagram of two management partitions, according to an embodiment. Even though only two management partitions are discussed with reference to FIG. 4B, more management partitions may be utilized in various embodiments. More particularly, management partition 2 (P2) holds the following three tables: (1) NV DIMM Current Configuration, stored by BIOS; (2) NV DIMM Configuration Request, stored by management application; and (3) NV DIMM Configuration Response, stored by BIOS.

Management Partition 1 (P1) holds NV DIMM current configuration, which also acts as the Last Known Good (LKG) configuration. NVM controller restricts access to P1 such that BIOS can read/write to P1, but OS driver/applications cannot. This ensures that a buggy/malicious OS software cannot directly wipe out LKG.

Figure 4C:
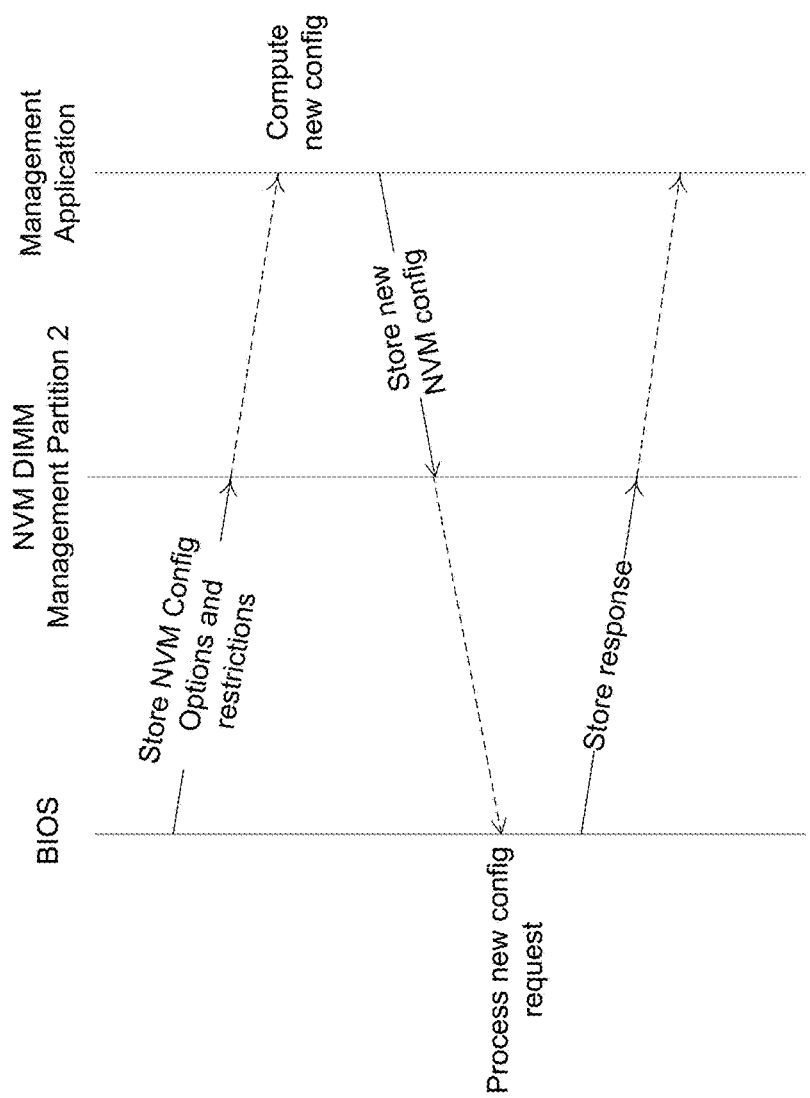
FIG. 4C illustrates a flow diagram of a method to configure memory, in accordance with an embodiment.

FIG. 4C illustrates a flow diagram of a method to configure memory, in accordance with an embodiment. In one embodiment, various components discussed with reference to FIGS. 1-4B and 5-7 may be utilized to perform one or more of the operations discussed with reference to FIG. 4C. In an embodiment, one or more operations of FIG. 4C are implemented in logic (e.g., firmware), such as logic 150 and/or controller 120 of FIG. 1 and/or other memory controllers discussed with reference to the other figures.

Referring to FIGS. 1 through 4C, first, NVM configuration/reconfiguration includes the following: (a) NVM management console queries the management application located on each system for information regarding NVM population and configuration options; (b) management application retrieves this information from ACPI tables and tables in P2; (c) Based on the NVM configuration information, input from the user, hint(s) from the workload scheduler and other management components, the NVM management console can compute the next NVM configuration for each system and communicate it to the management application. Second, management application stores the new configuration in NVM DIMM management partition 2 as shown in FIG. 4C. Third, upon reboot, BIOS reads the new configuration request from NVM DIMM management partition 2 and processes it. If there is no new request, BIOS will apply LKG configuration from management Partition 1. If BIOS is able to honor the request, it reconfigures the DIMMs and stores this configuration in management partition. If BIOS is unable to honor the request, it attempts to boot using LKG configuration. If LKG configuration does not work (e.g., due to a DIMM failure), BIOS will boot in NVM disabled mode. For every processed request, BIOS stores the response in management partition. Fourth, the response is consumed by the management application and NVM management console.

In case of a motherboard failure, the user can physically migrate the NVM DIMMs to a (e.g., identical) replacement system. The BIOS on the new system applies the LKG configuration and reconstructs the address map to match the failed system. If the user installs the DIMMs in incorrect order, BIOS can boot in NVM disabled mode and guide the user towards the correct configuration.

Utilization of some embodiments ensures end users are able to exploit the flexibility offered by NV DIMMs. This can be important in both datacenters as well as client market. In a datacenter environment, NVM DIMMs can be configured/reconfigured to match workloads, end user SLA (Service Level Agreement), or CSP TCO (Total Cost of Ownership). In an mission critical environment, such technologies can be used to configure hot added NVM DIMMs, etc. Also, one of the major concerns about NVDIMM technology and more generally local storage is the potential for loss of user data in case of system crash. To address this, some embodiments provide a way to mitigate those concerns.

For example, e.g., as discussed with reference to FIGS. 4A-4C, some embodiments operate as follows:

1. BIOS communicates various NVM configuration options and restrictions to management software layer;

2. Management Software layer determines the optimum NVM configuration under the constraints specified by BIOS. Management Software can utilize complex algorithms and user input during this process;

3. Management software communicates the desired configuration to the BIOS via dedicated partition located on each NVM DIMM;

4. BIOS processes the request from management software;
   a. If there is no new request, BIOS will apply Last Known Good (LKG) configuration. LKG configuration is stored on another dedicated partition on NVM DIMM. LKG partition can only be updated by BIOS;
   b. If BIOS is able to honor the request, it reconfigures the DIMMs and promotes this configuration as Last Known Good (LKG) configuration;
   c. If BIOS is unable to honor the request, it falls back to either the LKG configuration or NVM disabled mode;
   d. For every processed request, BIOS stores the response in NVM DIMM. The response is to be consumed by the management software; and/or 5. If the motherboard fails, the DIMMs can be moved to a like motherboard, where the BIOS can read the LKG configuration from the LKG partition in each DIMMs and set up the NVM address map to match the previous system. The user data stored on the DIMMs can now be retrieved using standard utilities.

Figure 5:
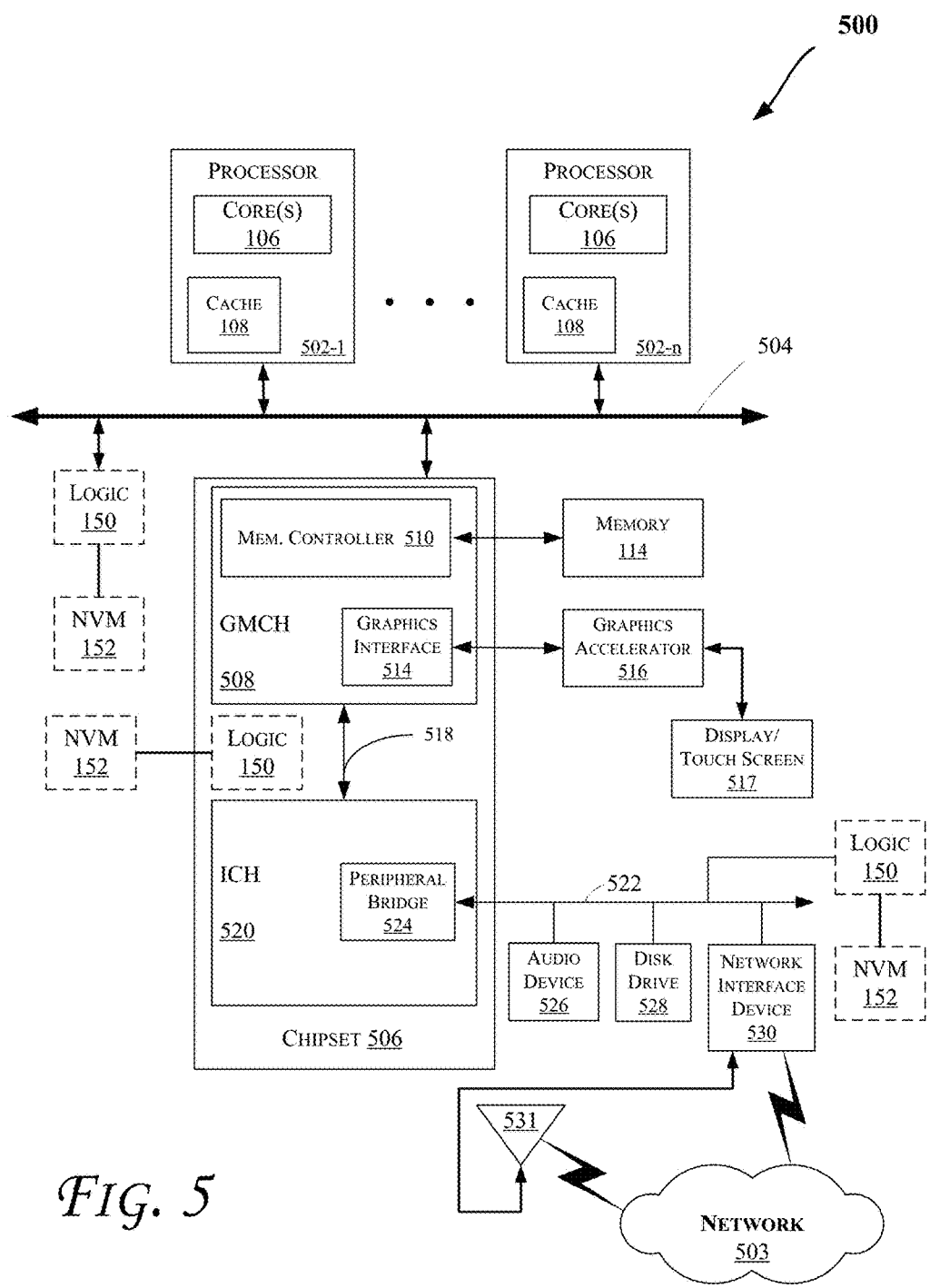

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may include a general purpose processor, a network processor (that processes data communicated over a computer network 503), an application processor (such as those used in cell phones, smart phones, etc.), or other types of a processor (including a reduced instruction set computer (RISC) processor or a complex instruction set computer (CISC)). Various types of computer networks 503 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 5G, Low Power Embedded (LPE), etc.). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors.

In an embodiment, one or more of the processors 502 may be the same or similar to the processors 102 of FIG. 1. For example, one or more of the processors 502 may include one or more of the cores 106 and/or cache 108. Also, the operations discussed with reference to FIGS. 1-4 may be performed by one or more components of the system 500.

A chipset 506 may also communicate with the interconnection network 504. The chipset 506 may include a graphics and memory control hub (GMCH) 508. The GMCH 508 may include a memory controller 510 (which may be the same or similar to the memory controller 120 of FIG. 1 in an embodiment) that communicates with the memory 114. System 500 may also include logic 150 (e.g., coupled to NVM 152) in various locations (such as those shown in FIG. 5 but can be in other locations within system 500 (not shown)). The memory 114 may store data, including sequences of instructions that are executed by the CPU 502, or any other device included in the computing system 500. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk, flash, byte addressable 3-Dimensional Cross Point Memory (such as PCM), Resistive Random Access Memory, NAND memory, NOR memory and STTRAM. Additional devices may communicate via the interconnection network 504, such as multiple CPUs and/or multiple system memories.

The GMCH 508 may also include a graphics interface 514 that communicates with a graphics accelerator 516. In one embodiment of the invention, the graphics interface 514 may communicate with the graphics accelerator 516 via an accelerated graphics port (AGP) or Peripheral Component Interconnect (PCI) (or PCI express (PCIe) interface). In an embodiment of the invention, a display 517 (such as a flat panel display, touch screen, etc.) may communicate with the graphics interface 514 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 517.

A hub interface 518 may allow the GMCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB) controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503, e.g., via a wired or wireless interface). As shown, the network interface device 530 may be coupled to an antenna 531 to wirelessly (e.g., via an Institute of Electrical and Electronics Engineers (IEEE) 802.11 interface (including IEEE 802.11a/b/g/n, etc.), cellular interface, 3G, 5G, LPE, etc.) communicate with the network 503. Other devices may communicate via the bus 522. Also, various components (such as the network interface device 530) may communicate with the GMCH 508 in some embodiments. In addition, the processor 502 and the GMCH 508 may be combined to form a single chip. Furthermore, the graphics accelerator 516 may be included within the GMCH 508 in other embodiments.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 6:
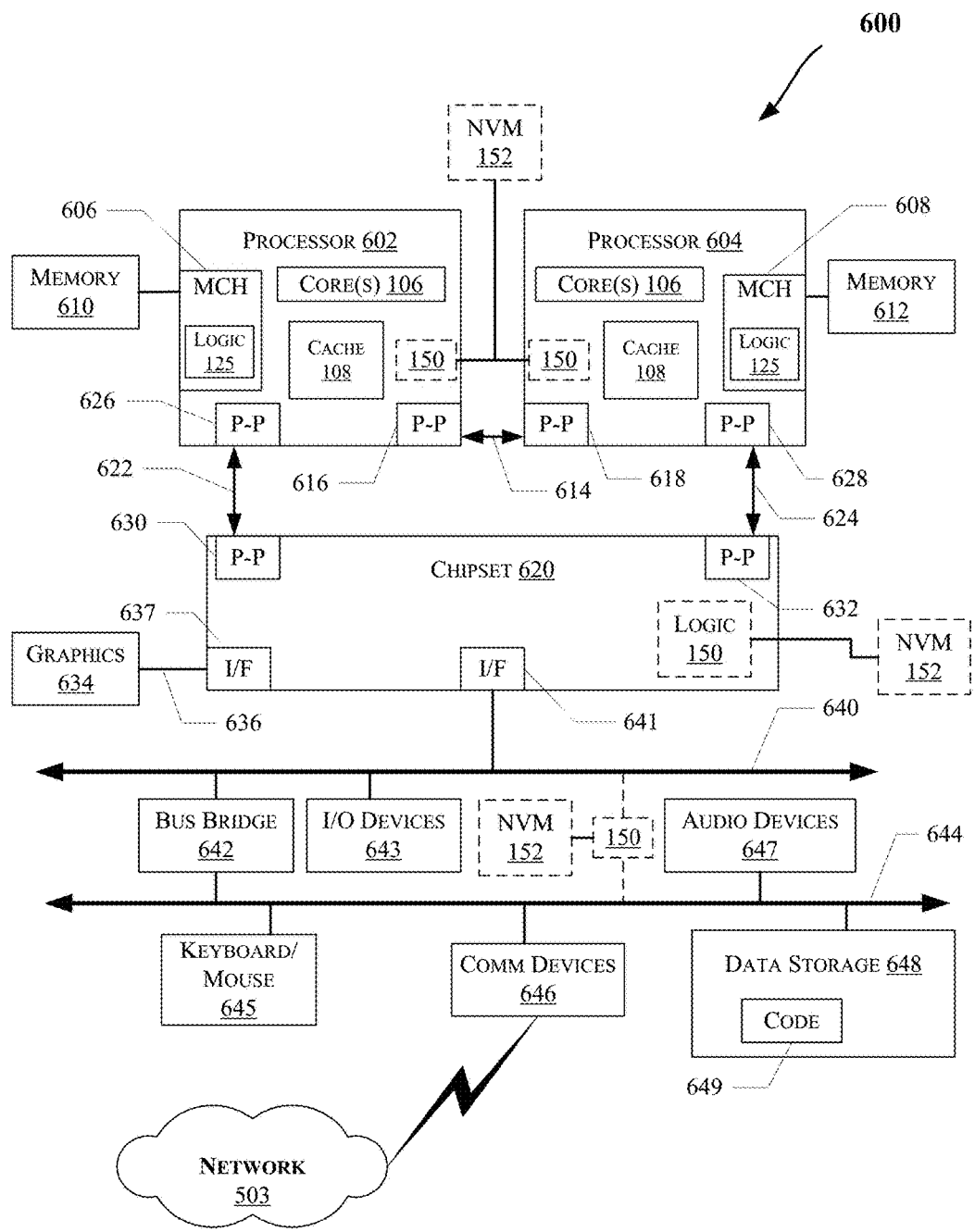

FIG. 6 illustrates a computing system 600 that is arranged in a point-to-point (PtP) configuration, according to an embodiment. In particular, FIG. 6 shows a system where processors, memory, and input/output devices are interconnected by a number of point-to-point interfaces. The operations discussed with reference to FIGS. 1-5 may be performed by one or more components of the system 600.

As illustrated in FIG. 6, the system 600 may include several processors, of which only two, processors 602 and 604 are shown for clarity. The processors 602 and 604 may each include a local memory controller hub (MCH) 606 and 608 to enable communication with memories 610 and 612. The memories 610 and/or 612 may store various data such as those discussed with reference to the memory 114 or NVM 152 of FIGS. 1 and/or 5. Also, MCH 606 and 608 may include the memory controller 120 and/or logic 150 of FIG. 1 in some embodiments.

In an embodiment, the processors 602 and 604 may be one of the processors 502 discussed with reference to FIG. 5. The processors 602 and 604 may exchange data via a point-to-point (PtP) interface 614 using PtP interface circuits 616 and 618, respectively. Also, the processors 602 and 604 may each exchange data with a chipset 620 via individual PtP interfaces 622 and 624 using point-to-point interface circuits 626, 628, 630, and 632. The chipset 620 may further exchange data with a high-performance graphics circuit 634 via a high-performance graphics interface 636, e.g., using a PtP interface circuit 637. As discussed with reference to FIG. 5, the graphics interface 636 may be coupled to a display device (e.g., display 517) in some embodiments.

As shown in FIG. 6, one or more of the cores 106 and/or cache 108 of FIG. 1 may be located within the processors 602 and 604. Other embodiments, however, may exist in other circuits, logic units, or devices within the system 600 of FIG. 6. Furthermore, other embodiments may be distributed throughout several circuits, logic units, or devices illustrated in FIG. 6.

The chipset 620 may communicate with a bus 640 using a PtP interface circuit 641. The bus 640 may have one or more devices that communicate with it, such as a bus bridge 642 and I/O devices 643. Via a bus 644, the bus bridge 642 may communicate with other devices such as a keyboard/mouse 645, communication devices 646 (such as modems, network interface devices, or other communication devices that may communicate with the computer network 503, as discussed with reference to network interface device 530 for example, including via antenna 531), audio I/O device, and/or a data storage device 648. The data storage device 648 may store code 649 that may be executed by the processors 602 and/or 604.

Figure 7:
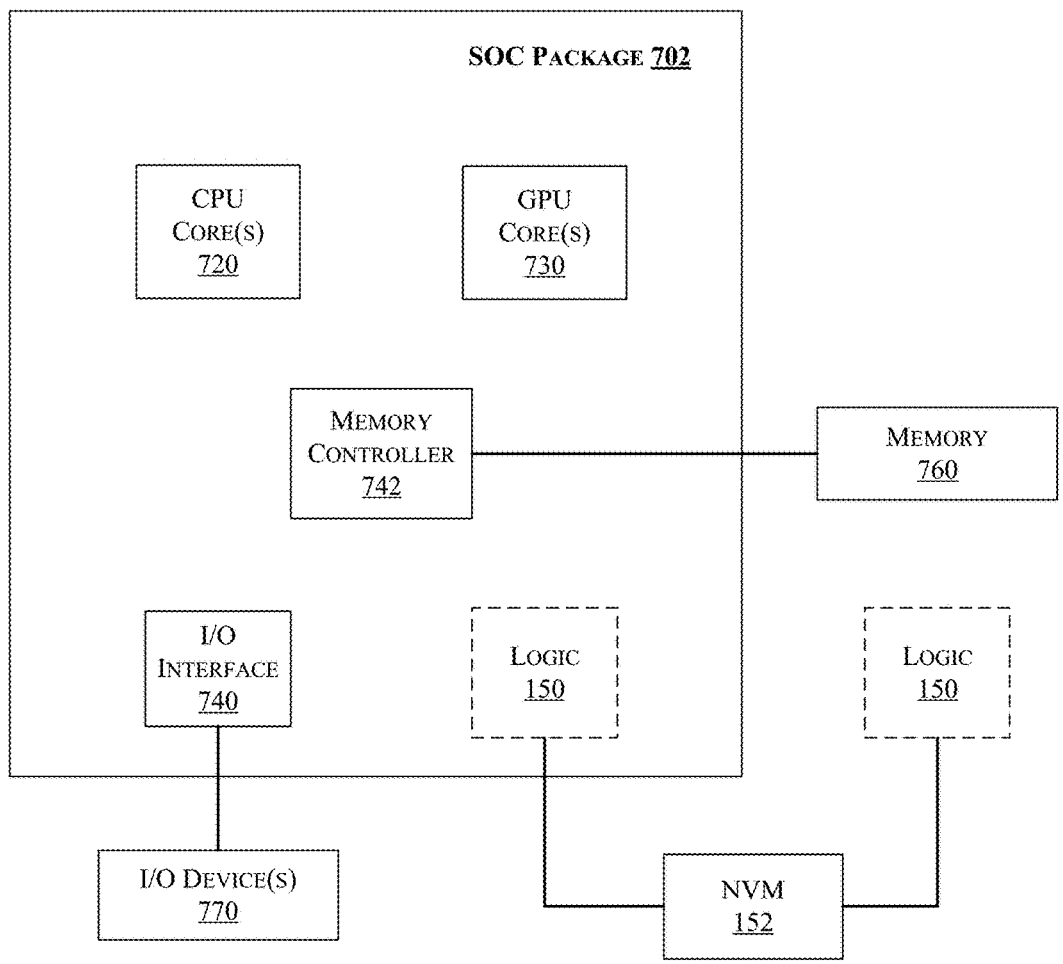

In some embodiments, one or more of the components discussed herein can be embodied on a System On Chip (SOC) device. FIG. 7 illustrates a block diagram of an SOC package in accordance with an embodiment. As illustrated in FIG. 7, SOC 702 includes one or more Central Processing Unit (CPU) cores 720, one or more Graphics Processor Unit (GPU) cores 730, an Input/Output (I/O) interface 740, and a memory controller 742 (which may be similar to or the same as memory controller 120 and/or logic 150). Various components of the SOC package 702 may be coupled to an interconnect or bus such as discussed herein with reference to the other figures. Also, the SOC package 702 may include more or less components, such as those discussed herein with reference to the other figures. Further, each component of the SOC package 720 may include one or more other components, e.g., as discussed with reference to the other figures herein. In one embodiment, SOC package 702 (and its components) is provided on one or more Integrated Circuit (IC) die, e.g., which are packaged onto a single semiconductor device.

As illustrated in FIG. 7, SOC package 702 is coupled to a memory 760 (which may be similar to or the same as memory discussed herein with reference to the other figures) via the memory controller 742. In an embodiment, the memory 760 (or a portion of it) can be integrated on the SOC package 702.

The I/O interface 740 may be coupled to one or more I/O devices 770, e.g., via an interconnect and/or bus such as discussed herein with reference to other figures. I/O device(s) 770 may include one or more of a keyboard, a mouse, a touchpad, a display, an image/video capture device (such as a camera or camcorder/video recorder), a touch screen, a speaker, or the like. Furthermore, SOC package 702 may include/integrate the logic 150 and/or memory controller 120 in an embodiment. Alternatively, the logic 150 and/or memory controller 120 may be provided outside of the SOC package 702 (i.e., as a discrete logic).

The following examples pertain to further embodiments. Example 1 includes an apparatus comprising: memory controller logic, coupled to non-volatile memory, to configure the non-volatile memory into a plurality of partitions at least in part based on one or more attributes, wherein one or more volumes visible to an application or operating system are to be formed from one or more of the plurality of partitions, wherein each of the one or more volumes is to comprise one or more of the plurality of partitions having at least one similar attribute from the one or more attributes. Example 2 includes the apparatus of example 1, wherein the non-volatile memory is to be mapped into a processor's address space to allow the processor to directly address the non-volatile memory. Example 3 includes the apparatus of example 1, wherein the one or more attributes are to comprise one or more of: UMA (Uniform Memory Access), NUMA (Non-Uniform Memory Access), interleave type, communication channel width or speed, type of fault domain, or mirroring state. Example 4 includes the apparatus of example 1, wherein the one or more volumes are to maintain their content across system resets or power loss. Example 5 includes the apparatus of example 1, wherein the non-volatile memory is to comprise one or more non-volatile DIMMs (Dual Inline Memory Modules). Example 6 includes the apparatus of example 1, wherein the non-volatile memory is to comprise one or more of: nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, and Phase Change Memory (PCM). Example 7 includes the apparatus of example 1, wherein one or more processor cores are coupled to the memory controller logic to access data stored in the non-volatile memory. Example 8 includes the apparatus of example 1, wherein one or more of the memory controller logic, one or more processor cores, and the non-volatile memory are on a same integrated circuit die.

Example 9 includes an apparatus comprising: memory controller logic, coupled to a Non-Volatile Memory (NVM) Dual Inline Memory Module (DIMM), to configure the NVM DIMM into a persistent region and a volatile region, wherein the NVM DIMM is to be mapped into a processor's address space to allow the processor to directly address the NVM DIMM, wherein the NVM DIMM is to utilize at least two management partitions, wherein the management partitions are to be accessible even prior to the NVM DIMM having been mapped into the processor's address space. Example 10 includes the apparatus of example 9, wherein the management partitions are to be accessible via a management interface. Example 11 includes the apparatus of example 10, wherein one or more of a Basic Input/Output System (BIOS) or an NVM driver are to utilize the management interface to access the management partitions. Example 12 includes the apparatus of example 11, wherein the NVM driver is to utilize the management interface at least in part based on information from an Advanced Configuration and Power Interface (ACPI). Example 13 includes the apparatus of example 9, wherein one of the at least two management partitions is to store information corresponding to a last known good configuration of the NVM DIMM. Example 14 includes the apparatus of example 13, wherein a partition that stores data corresponding to the last known good configuration is to be protected from operating system. Example 15 includes the apparatus of example 13, wherein a Basic Input/Output System (BIOS) is to access data stored in a partition that stores data corresponding to the last known good configuration. Example 16 includes the apparatus of example 13, wherein management software is to utilize one of the at least two management partitions to communicate NVM configuration data to a BIOS. Example 17 includes the apparatus of example 13, wherein, in case of motherboard failure, the NVM DIMM is to be migrated to a replacement system based at least in part on the last known good configuration information. Example 18 includes the apparatus of example 9, wherein the NVM DIMM is to comprise one or more of: nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, and Phase Change Memory (PCM). Example 19 includes the apparatus of example 9, wherein one or more processor cores are coupled to the memory controller logic to access data stored in the NVM DIMM.

Example 20 includes a method comprising: configuring non-volatile memory into a plurality of partitions at least in part based on one or more attributes, wherein one or more volumes visible to an application or operating system are formed from one or more of the plurality of partitions, wherein each of the one or more volumes comprises one or more of the plurality of partitions having at least one similar attribute from the one or more attributes. Example 21 includes the method of example 20, further comprising mapping the non-volatile memory into a processor's address space to allow the processor to directly address the non-volatile memory. Example 22 includes the method of example 20, wherein the one or more attributes are to comprise one or more of: UMA (Uniform Memory Access), NUMA (Non-Uniform Memory Access), interleave type, communication channel width or speed, type of fault domain, or mirroring state.

Example 23 includes a method comprising: configuring a NVM DIMM into a persistent region and a volatile region, wherein the NVM DIMM is mapped into a processor's address space to allow the processor to directly address the NVM DIMM, wherein the NVM DIMM is to utilize at least two management partitions, wherein the management partitions are to be accessible even prior to the NVM DIMM having been mapped into the processor's address space. Example 24 includes the method of example 23, wherein the management partitions are to be accessible via a management interface. Example 25 includes the apparatus of example 24, wherein one or more of a Basic Input/Output System (BIOS) or an NVM driver are to utilize the management interface to access the management partitions.

Example 26 includes a system comprising: a processor, having one or more processor cores; and memory controller logic, coupled to the processor and non-volatile memory, to configure the non-volatile memory into a plurality of partitions at least in part based on one or more attributes, wherein one or more volumes visible to an application or operating system are to be formed from one or more of the plurality of partitions, wherein each of the one or more volumes is to comprise one or more of the plurality of partitions having at least one similar attribute from the one or more attributes. Example 27 includes the system of example 26, wherein the non-volatile memory is to be mapped into an address space of the processor to allow the processor to directly address the non-volatile memory. Example 28 includes the system of example 26, wherein the one or more attributes are to comprise one or more of: UMA (Uniform Memory Access), NUMA (Non-Uniform Memory Access), interleave type, communication channel width or speed, type of fault domain, or mirroring state.

Example 29 includes a system comprising: a processor having one or more processor cores; and memory controller logic, coupled to the processor and a Non-Volatile Memory (NVM) Dual Inline Memory Module (DIMM), to configure the NVM DIMM into a persistent region and a volatile region, wherein the NVM DIMM is to be mapped into a processor's address space to allow the processor to directly address the NVM DIMM, wherein the NVM DIMM is to utilize at least two management partitions, wherein the management partitions are to be accessible even prior to the NVM DIMM having been mapped into the processor's address space. Example 30 includes the system of example 29, wherein the management partitions are to be accessible via a management interface. Example 31 includes the system of example 30, wherein one or more of a Basic Input/Output System (BIOS) or an NVM driver are to utilize the management interface to access the management partitions.

Example 32 includes an apparatus comprising means to perform a method as set forth in any preceding example.

Example 33 comprises machine-readable storage including machine-readable instructions, when executed, to implement a method or realize an apparatus as set forth in any preceding example.

In various embodiments, the operations discussed herein, e.g., with reference to FIGS. 1-7, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-7.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
memory controller logic, coupled to non-volatile memory (NVM), to configure the NVM into a plurality of partitions at least in part based on one or more attributes,
wherein one or more volumes visible to an application or operating system are to be formed from one or more of the plurality of partitions, wherein each of the one or more volumes is to comprise one or more of the plurality of partitions having at least one similar attribute from the one or more attributes, wherein the NVM is to utilize at least two management partitions, wherein the management partitions are to be accessible prior to the NVM having been mapped into a processor's address space, wherein a first management partition from the at least two management partitions is read or write accessible by a Basic Input/Output System (BIOS), wherein the first management partition is read or write inaccessible by the application or the operating system.

2. The apparatus of claim 1, wherein the NVM is to be mapped into a processor's address space to allow the processor to directly address the NVM.

3. The apparatus of claim 1, wherein the one or more attributes are to comprise one or more of: UMA (Uniform Memory Access), NUMA (Non-Uniform Memory Access), interleave type, communication channel width or speed, type of fault domain, or mirroring state.

4. The apparatus of claim 1, wherein the one or more volumes are to maintain their content across system resets or power loss.

5. The apparatus of claim 1, wherein the NVM is to comprise one or more non-volatile DIMMs (Dual Inline Memory Modules).

6. The apparatus of claim 1, wherein the NVM is to comprise one or more of: nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, and Phase Change Memory (PCM).

7. The apparatus of claim 1, wherein one or more processor cores are coupled to the memory controller logic to access data stored in the NVM.

8. The apparatus of claim 1, wherein one or more of the memory controller logic, one or more processor cores, and the NVM are on a same integrated circuit die.

9. A method comprising:
configuring non-volatile memory (NVM) into a plurality of partitions at least in part based on one or more attributes,
wherein one or more volumes visible to an application or operating system are formed from one or more of the plurality of partitions, wherein each of the one or more volumes comprises one or more of the plurality of partitions having at least one similar attribute from the one or more attributes, wherein the NVM utilizes at least two management partitions, wherein the management partitions are accessible prior to the NVM having been mapped into a processor's address space, wherein a first management partition from the at least two management partitions is read or write accessible by a Basic Input/Output System (BIOS), wherein the first management partition is read or write inaccessible by the application or the operating system.

10. The method of claim 9, further comprising mapping the NVM into a processor's address space to allow the processor to directly address the NVM.

11. The method of claim 9, wherein the one or more attributes are to comprise one or more of: UMA (Uniform Memory Access), NUMA (Non-Uniform Memory Access), interleave type, communication channel width or speed, type of fault domain, or mirroring state.

12. The method of claim 9, wherein the one or more volumes maintain their content across system resets or power loss.

13. The method of claim 9, wherein the NVM comprises one or more non-volatile DIMMs (Dual Inline Memory Modules).

14. The method of claim 9, wherein the NVM comprises one or more of: nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, and Phase Change Memory (PCM).

15. One or more non-transitory computer-readable medium comprising one or more instructions that when executed on at least one processor configure the at least one processor to perform one or more operations to cause:
configuration of non-volatile memory (NVM) into a plurality of partitions at least in part based on one or more attributes,
wherein one or more volumes visible to an application or operating system are formed from one or more of the plurality of partitions, wherein each of the one or more volumes comprises one or more of the plurality of partitions having at least one similar attribute from the one or more attributes, wherein the NVM is to utilize at least two management partitions, wherein the management partitions are to be accessible prior to the NVM having been mapped into a processor's address space, wherein a first management partition from the at least two management partitions is read or write accessible by a Basic Input/Output System (BIOS), wherein the first management partition is read or write inaccessible by the application or the operating system.

16. The one or more non-transitory computer-readable medium of claim 15, wherein the one or more computer-readable medium comprise one or more instructions that when executed on the at least one processor configure the at least one processor to perform one or more operations to cause mapping of the NVM into an address space of the processor to allow the processor to directly address the NVM.

17. The one or more non-transitory computer-readable medium of claim 15, wherein the one or more attributes are to comprise one or more of: UMA (Uniform Memory Access), NUMA (Non-Uniform Memory Access), interleave type, communication channel width or speed, type of fault domain, or mirroring state.

18. The one or more non-transitory computer-readable medium of claim 15, wherein the one or more volumes maintain their content across system resets or power loss.

19. The one or more non-transitory computer-readable medium of claim 15, wherein the NVM comprises one or more non-volatile DIMMs (Dual Inline Memory Modules).

20. The one or more non-transitory computer-readable medium of claim 15, wherein the NVM comprises one or more of: nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, and Phase Change Memory (PCM).

* * * * *